United States Patent
Risbo (10) Patent No.: US 7,626,519 B2
(45) Date of Patent: Dec. 1, 2009

(54) PULSE-WIDTH MODULATION OF PULSE-CODE MODULATED SIGNALS AT SELECTABLE OR DYNAMICALLY VARYING SAMPLE RATES

(75) Inventor: Lars Risbo, Hvalsø (DK)

(73) Assignee: Texas Instruments Incorporated, Dalllas, TX (US)

( * ) Notice: Subject to any disclaimer, the term of this patent is extended or adjusted under 35 U.S.C. 154(b) by 0 days.

(21) Appl. No.: 12/127,173

(22) Filed: May 27, 2008

(65) Prior Publication Data

US 2008/0297382 A1 Dec. 4, 2008

Related U.S. Application Data

(60) Provisional application No. 60/940,844, filed on May 30, 2007.

(51) Int. Cl.
*H03M 5/08* (2006.01)

(52) U.S. Cl. .......................................... 341/53; 375/238

(58) Field of Classification Search ............. 341/50–80; 375/238, 239, 242; 381/38, 121, 94.5, 71.1
See application file for complete search history.

(56) References Cited

U.S. PATENT DOCUMENTS

| | | | |
|---|---|---|---|
| 6,657,566 B1 | 12/2003 | Risbo et al. | |
| 7,224,728 B2 * | 5/2007 | Komamura | ................. 375/238 |
| 7,308,027 B1 * | 12/2007 | Gaboriau et al. | ............ 375/238 |
| 7,317,758 B2 * | 1/2008 | Alrutz et al. | ................. 375/238 |
| 7,492,217 B2 * | 2/2009 | Hansen et al. | ................. 330/10 |
| 2004/0184621 A1 * | 9/2004 | Andersen et al. | ............ 381/106 |
| 2005/0110667 A1 | 5/2005 | Borisavljevic | |
| 2005/0122241 A1 | 6/2005 | Magrath | |
| 2005/0254573 A1 | 11/2005 | Midya et al. | |

OTHER PUBLICATIONS

Midya, "Generation of Variable Frequency Digital PWM", Paper No. 7227, Presented at the 123rd Convention of the Audio Engineering Society (Oct. 5-8, 2007).
"Generation of Variable Frequency Digital PWM," Audio Engineering Society Convention Paper 7227, presented at the 123rd Convention, Oct. 5-7, 2007, New York, US, pp. 1-10 (Pallab Midya).

* cited by examiner

*Primary Examiner*—Lam T Mai
(74) *Attorney, Agent, or Firm*—John J. Patti; Wade J. Brady, III; Frederick J. Telecky, Jr.

(57) ABSTRACT

Digital audio circuitry including modulation circuitry (35; 135) for generating a pulse-width modulated (PWM) signal from processed pulse-code modulated (PCM) audio signals. The modulation circuitry includes a duration quantizer function (32) that generates a sequence of duration values d(k) from received PCM samples, quantized to integer multiples of periods of a master PWM clock ($CLK_{pwm}$). The duration quantizer function also produces a feedback PCM value x(k) from each quantized duration value d(k) that is applied to a loop filter (36), the output of which modifies the received PCM sample stream to suppress quantization noise. Transient effects caused by modulation or abrupt changes in the desired PWM period are suppressed by digitally filtering (34; 134) the PWM period sample stream.

27 Claims, 6 Drawing Sheets

PULSE-WIDTH MODULATION OF PULSE-CODE MODULATED SIGNALS AT SELECTABLE OR DYNAMICALLY VARYING SAMPLE RATES

CROSS-REFERENCE TO RELATED APPLICATIONS

This application claims priority, under 35 U.S.C. §119(e), of Provisional Application No. 60/940,844, filed May 30, 2007, incorporated herein by this reference.

STATEMENT REGARDING FEDERALLY SPONSORED RESEARCH OR DEVELOPMENT

Not applicable.

BACKGROUND OF THE INVENTION

This invention is in the field of signal conversion, and is more specifically directed to the pulse-width modulation (PWM) of pulse-code modulated (PCM) signals.

As is well known in the communications art, information can be communicated by way of modulations in an electrical signal. Many classes of modulation approaches are well-known in the art, including amplitude modulation, frequency modulation, and phase modulation. In the digital signal domain, pulse-code modulation (PCM) refers to amplitude modulation in which the amplitude of each pulse of a periodic signal train is quantized into one of a number of available amplitude levels, each available amplitude level corresponding to the value of a digital word. Pulse-width modulation (PWM) is another well-known modulation approach, in which the duty cycle of each pulse in a signal train indicates the digital word value.

Certain electronic systems require the conversion of a signal from one modulation scheme to another. For example, modern digital audio systems typically carry out digital audio signal processing, such as the application of digital filters and the like, upon PCM digital signals, because the clock rate for such processing can be kept relatively slow. On the other hand, digital audio amplifiers (i.e., Class D amplifiers) drive speakers with PWM signals at a significantly higher frequency, to attain good resolution of high frequency audio signal components. Accordingly, these modern digital audio systems must convert the output of the digital audio signal processing functions from PCM signals into the PWM signals appropriate for driving the audio speakers.

Figure 1A:
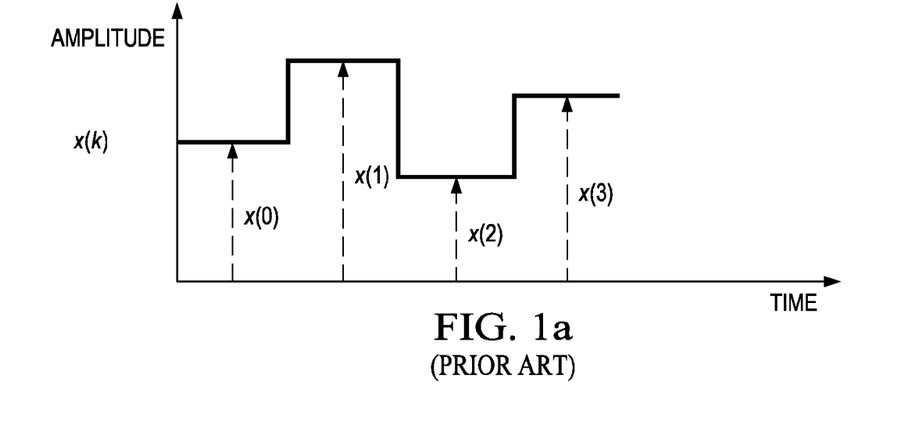
FIGS. 1a and 1b are timing diagrams illustrating a PCM signal, and a PWM signal converted from that PCM signal, respectively.
Figure 1B:
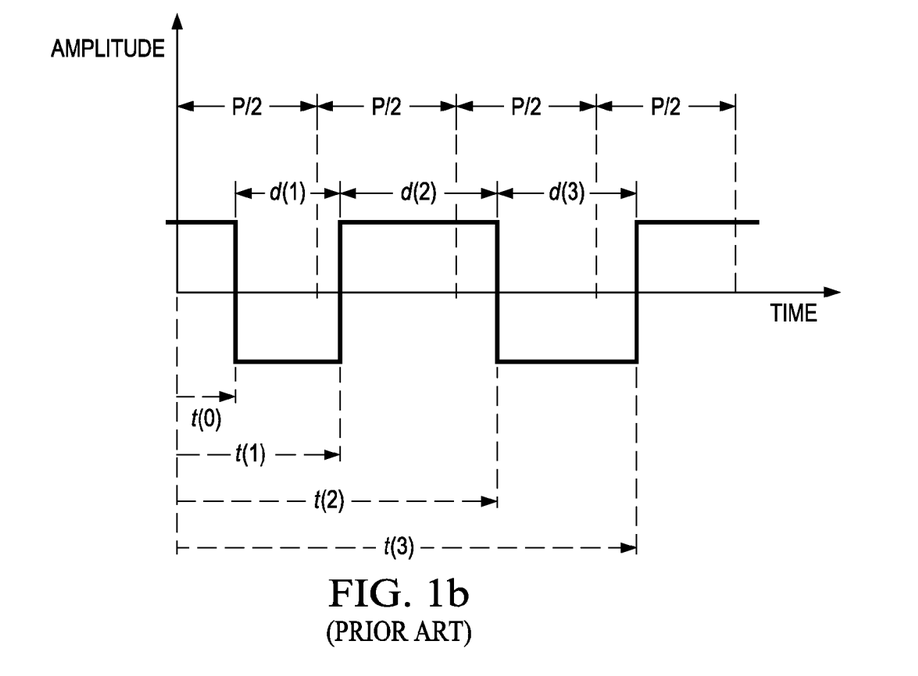

FIG. 1a illustrates a PCM signal modulated according to the well-known "AD2" approach, and FIG. 1b illustrates a PWM signal converted from the PCM signal in FIG. 1a. "AD2" conversion refers to controlling a single PWM pulse with two successive PCM sample values; the first PCM sample indicates the location of a rising edge of the PWM signal within a first half-cycle of the PWM signal, and the second PCM sample indicates the location of a falling edge within a second half-cycle of the PWM signal. This approach to pulse-width modulating an input digital sample stream is also referred to as "two-sample consecutive edge PWM".

The portion of the PCM signal shown in FIG. 1a includes an arbitrary signal expressed as a sequence including four PCM amplitude values x(0) through x(3). The corresponding PWM signal shown in FIG. 1b converted from that PCM signal includes four transition edges at times t(0) through t(3), at a fixed PWM rate expressed as period P. In this conversion, the position in time t(0) of a falling edge of the PWM signal within half-period P/2, corresponds to the amplitude of sample x(0) in the PCM signal. Time t(1) of the next rising edge, within the next half-period P/2, corresponds to the amplitude of the next sample x(1) in the PCM signal. In general, the AD2 mapping of PCM signal x(k) to a corresponding PWM signal expressed as a sequence of the transition times t(k), follows:

$$t(k) = \frac{P}{2}(k+1) + \frac{P}{4}(-1)^k x(k) \qquad (1)$$

The factor $(-1)^k$ ensures that falling edges move in a positive direction in time and rising edges move in a negative direction in time with increasing x(k). The PWM signal can also be expressed in terms of the durations d(k) of pulse segments in the sequence, by way of:

$$d(k) = t(k) - t(k-1) \qquad (2)$$
$$= \frac{1}{2}P + \frac{(-1)^k}{4} P \cdot (x(k) + x(k-1))$$

These expressions accurately describe the PCM-PWM mapping for fixed time periods P of the PWM signal. In practice, however, the transition times t(k) resulting from the conversion must be aligned with a clock grid that is defined by the master PWM clock. This requires that all pulse durations d(k) of the PWM signal equal integer multiples of periods of the master high-speed PWM clock.

Figures 2, 6A:
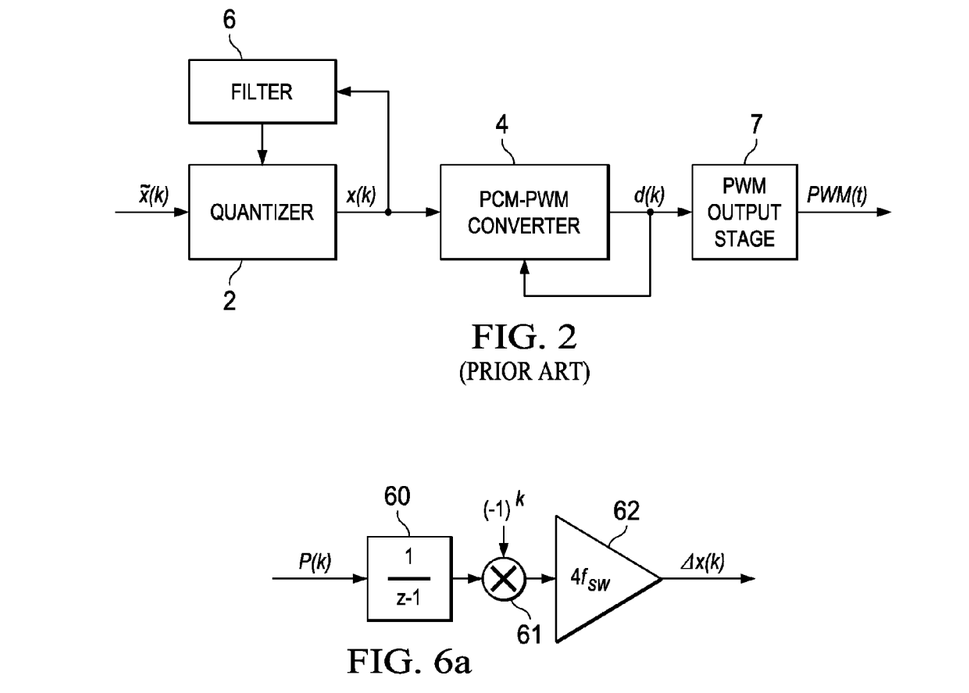
FIG. 2 is an electrical diagram, in block form, illustrating a conventional PCM-PWM conversion function.
FIGS. 6a through 6c are signal models of modulation or perturbation of the PWM period in the operation of the modulation circuitry of FIG. 5.

To ensure this edge alignment of the resulting PWM signal, conventional PCM-PWM conversion quantizes the PCM signal x(k) to only those values that map to transition times aligned with the PWM clock. FIG. 2 illustrates this approach in block diagram form. In this arrangement, the input PCM signal stream x̃(k) is applied to quantizer 2, which produces a quantized PCM signal x(k) at levels that guarantee that the corresponding PWM transition times t(k) align with the PWM clock grid. Quantizer 2 is a conventional fixed uniform quantizer function, given a fixed PWM period P at a integer multiple of the fundamental PWM clock period. Loop filter 6 applies noise shaping to quantizer 2, based on the error in the quantized PCM signal x(k). Conversion function 4 converts the quantized PCM signal x(k) to pulse segment duration sequence d(k). Sequence d(k) is applied to a conventional PWM output stage 7, which in response produces a continuous-time pulse-width modulated signal PWM(t), at the fixed PWM clock rate and at a duty cycle corresponding to the pulse segment durations d(k). Conceptually, non-linear feedback from the output of conversion function 4 corrects for the inherent nonlinearity of the PCM to PWM mapping. In practice, the quantized PCM signal x(k) feeds a non-linear model to produce the feedback signal into the noise shaping loop filter, or a feed-forward correction is produced according to a non-linear model. Such non-linear correction is well-known in the art, for example as described in my U.S. Pat. No. 6,657,566 B1, incorporated herein by this reference. As described above, the quantization applied by quantizer 2 ensures that the transitions t(k) corresponding to the pulse segment duration sequence d(k) are aligned with the clock grid of the PWM clock.

While the scheme of FIG. 2 efficiently and accurately converts the input PCM signal stream x̃(k) to a PWM output signal, this quantization and conversion approach holds only for a PWM period P at an integer multiple of the PWM clock rate. This constraint on the PWM signal eliminates the possibility of dynamically varying the PWM clock rate during operation.

By way of further background, the dynamic variation of the PWM output signal rate can be useful in certain system applications. For example, it is desirable to produce the PWM signal at a period P that is selected to avoid harmonic frequencies that interfere with AM radio reception. In addition, it may be desirable in many applications to implement spread spectrum frequency modulation of the PWM signal, which requires dynamic variation of the PWM frequency. However, these selectable or dynamically varying PWM periods are, in general, not compatible with maintaining the PWM period only at integer multiples of the master PWM clock period. In addition, abrupt or dynamic changes in the PWM period generally produce wide-band noise, including substantial noise energy in the audio band.

BRIEF SUMMARY OF THE INVENTION

It is therefore an object of this invention to provide a circuit and a method for performing conversion of a signal from a pulse-code modulated (PCM) form to a pulse-width modulated (PWM) signal, in which the period of the resulting PWM signal can be selected over a continuous range.

It is a further object of this invention to provide such a circuit and method for performing such conversion in which the period of the resulting PWM signal can by dynamically adjusted during operation.

It is a further object of this invention to provide such a circuit and method in which the PWM signal can be slaved to an input sample rate of the PCM signal yet operate from a fixed clock frequency.

It is a further object of this invention to provide such a circuit and method in which transients in the output PWM signal are reduced despite an abrupt change in the PWM period.

Other objects and advantages of this invention will be apparent to those of ordinary skill in the art having reference to the following specification together with its drawings.

The present invention may be implemented into modulator circuitry that receives PCM signals and produces PWM signals. Each sample of the received desired PCM input signal is combined with a current value of the desired PWM period to produce a duration value for a current PWM pulse; this duration value is quantized so that its transition times are aligned with the PWM clock grid for the current value of the PWM period. The circuitry calculates a PCM signal value from this quantized duration value, and feeds this value back into a loop filter to suppress quantization noise. Suppression of transients in the output PWM signal from changes in the PWM period is attained by applying filter functions to the PWM period value applied in the modulation.

DETAILED DESCRIPTION OF THE INVENTION

The present invention will be described in connection with its preferred embodiment, namely as implemented into a digital system having audio functionality, specifically a digital audio receiver in the described example in this specification. However, it is contemplated that the modulation function and method of this invention will be useful and beneficial in a wide range of system applications. These system applications can include any system in which processed digital signals are to be converted into a pulse-width modulated form, for example to actuate a physical device such as a speaker, motor, or other mechanical device. Accordingly, it is to be understood that the following description is provided by way of example only, and is not intended to limit the true scope of this invention as claimed.

Figure 3:
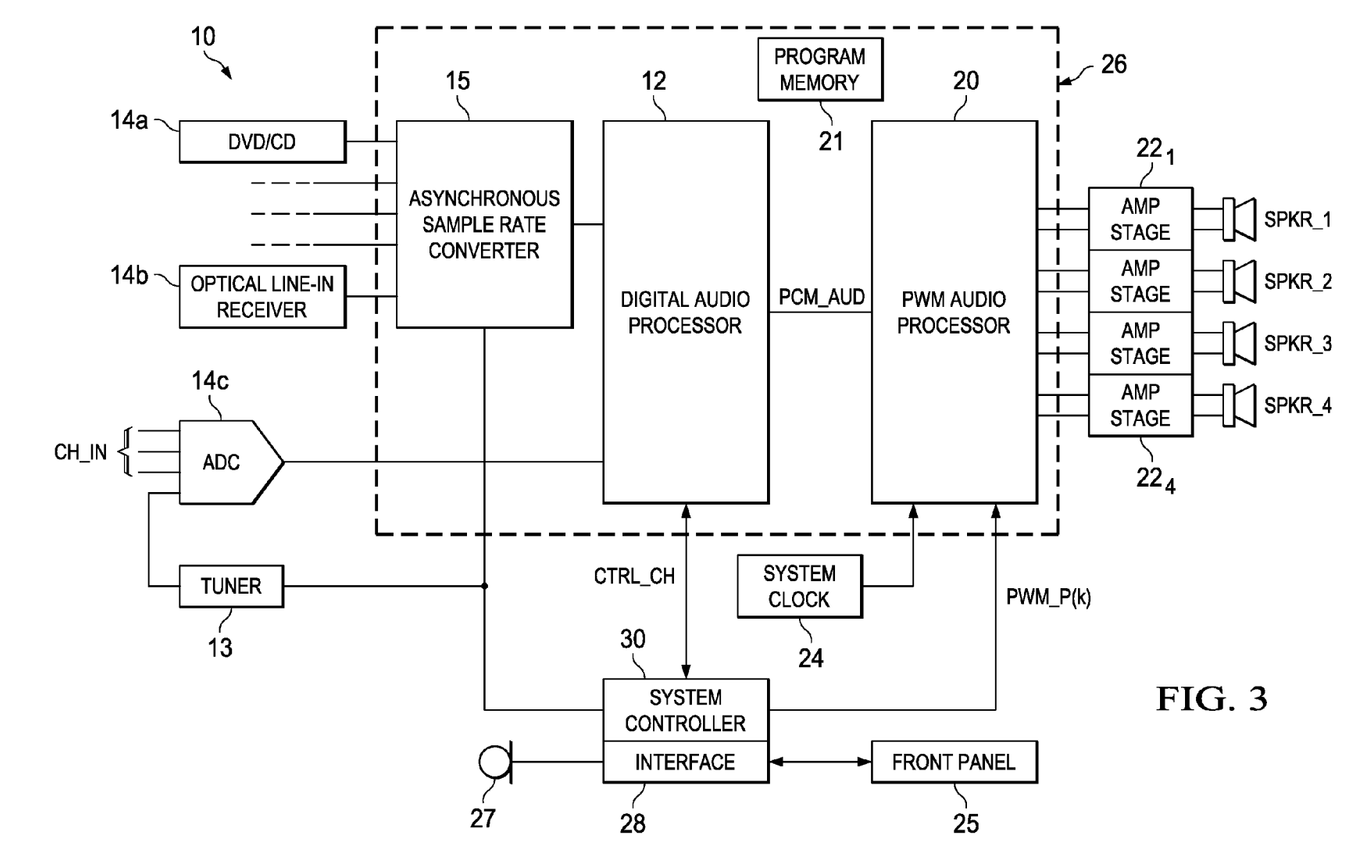
FIG. 3 is an electrical diagram, in block form, of a digital audio receiver constructed according to the preferred embodiments of the invention.

FIG. 3 illustrates an example of the construction of audio processing circuitry in digital audio receiver 10 according to the preferred embodiment of the invention. Receiver 10 may be implemented into an audio-video receiver, in which case video data paths (not shown) will also be provided, substantially in parallel with the audio processing functions shown in FIG. 3.

In the example of receiver 10, multiple sources of audio signals are available to receiver 10, for processing by digital audio processor 12 into a pulse-code-modulated (PCM) output signal. In this example, asynchronous sample rate converter (ASRC) 15 receives digital audio from DVD/CD controller 14a, such audio corresponding to audio content in conjunction with DVD movies or audio CDs played on a player (not shown) to which receiver 10 is connected. Optical line-in receiver 14b provides digital audio, for example from satellite or cable television sources, to another input of ASRC 15. Other digital inputs are also provided to ASRC 15, as suggested in FIG. 2. ASRC 15, in this case, produces a digital sample stream at a desired sample rate (e.g., 48 kHz) from each of these digital input sources, for application to digital audio processor 12. Analog-to-digital converter (ADC) 14c converts analog stereo signals from analog line-in inputs CH_IN and from tuner 13 to a digital datastream that is also applied to digital audio processor 12. The selection of the particular audio source for output is under user control; in this regard, system controller 30 receives direct selection inputs from front panel switches 25 of receiver 10, or infrared remote control signals via infrared receiver 27, both communicating with system controller 30 via interface circuitry 28.

Digital audio processor 12 is a conventional integrated circuit, or integrated circuit core, for decoding and digitally processing the digital audio signals from multiplexer 16. Alternatively, digital audio processor 12 may be implemented as part of a larger-scale integrated circuit for decoding and processing digital video and audio signals, an example of which is an MPEG-2 decoder implemented using a digital signal processor such as from the DA610 class of digital signal processors available from Texas Instruments Incorporated. In either case, examples of functions performed by digital audio processor 12 include decoding of the incoming digital data, applying the various digital audio data to corresponding channels supported by receiver 10, applying digital filters, and formatting the digital audio data into a pulse-code-modulated (PCM) format. The PCM signals for each channel are then forwarded to pulse-width-modulation (PWM) audio processor 20.

According to this embodiment of the invention, PWM audio processor 20 converts the PCM digital audio signals received at its inputs from digital audio processor 12, into corresponding pulse-width-modulated (PWM) signals output signals for the audio output channels. For each of the four channels in this example, PWM audio processor 20 produces a separate PWM control signal that is applied to a corresponding power amplifier stage $22_1$ through $22_4$, each of which drives a respective one of loudspeakers SPKR_1 through SPKR_4, as shown in FIG. 3. Of course, more or fewer channels may be supported by receiver 10. The construction of the modulation functionality within PWM audio processor 20 that performs the PCM to PWM conversion, according to the preferred embodiment of the invention, will be described in further detail below.

PWM audio processor 20 preferably includes conventional circuitry for controlling the volume of the audio output, performing the conventional functions of parametric speaker equalization or "voicing", implementation of graphic equalizer presets, treble and bass adjustment, and precision soft volume control on the audio signal being processed for its channel. Other digital functions that can be performed by PWM audio processor 20 include loudness compensation to boost bass frequencies when the output for the channel is low, dynamic range compression, background noise floor compensation or noise squelch, center or sub-woofer channel synthesis, programmable dither, peak limiting and clipping, and other digital filter processing.

In FIG. 3, digital audio processor 12, PWM audio processor 20, and ASRC 15 are illustrated as separate functions. It is contemplated, however, that these digital functions may readily be integrated into a single integrated circuit, and indeed such integration is preferred for the benefits of reduced manufacturing cost, improved device matching, and the like. For example, one or more of the functions of ASRC 15, digital audio processor 12, and PWM audio processor 20 may be implemented by way of one or more software routines executed by a digital signal processor integrated circuit, or a digital signal processor "core" within a larger scale integrated circuit. In such a case, it is contemplated that program memory will be provided in connection with such a digital signal processor or DSP core, within which the program instructions for these functions are stored. For example, FIG. 3 illustrates ASRC 15, digital audio processor 12, and PWM audio processor 20 as realized by digital signal processor 26, in which program memory 21 stores the program instructions to be executed by digital signal processor 26 in carrying out the functions of ASRC 15, digital audio processor 12, and PWM audio processor 20. In that example, the particular functions of PWM audio processor 20 in performing the PCM-to-PWM conversion functions according to the preferred embodiment of the invention will be realized by such program instructions stored in program memory 21 and executed by digital signal processor 26. Of course, it is contemplated that dedicated circuit hardware may instead be used to realize PWM audio processor 20 according to this preferred embodiment of the invention, as well as the other functions of receiver 10, in the alternative to programmable logic or in combination therewith. It is further contemplated that these functions may alternatively be realized in separate integrated circuits, depending on the particular desired system implementation.

As mentioned above, system controller 30 provides audio source selection signals to ASRC 15 and multiplexer 16, and channel volume control signals to PWM audio processor 20. System controller 30 also provides other control signals throughout receiver 10, including channel selection control to tuner 16 in response to user inputs received via front panel 25 or infrared receiver 27, and operational control signals applied to digital audio processor 12. According to the preferred embodiment of this invention, system controller 30 also controls the pulse-width modulation rate or frequency at which the output of PWM audio processor 20 is to be produced, by way of its control signal PWM_P(k) that is applied to PWM audio processor 20. System clock circuitry 24 provides a high-speed clock signal at a fixed frequency to PWM audio processor 20, and also one or more clock signals at desired frequencies to the other functions of receiver 10, in the conventional manner. As will be described in further detail below, the PWM output signals produced by PWM audio processor 20 will be aligned to have durations at integer multiples of the period of this high-speed PWM clock signal, at duty cycles consistent with the current value of the desired PWM period selected by system controller 30 via control signal PWM_P(k).

It is contemplated that the manner in which system controller 30 establishes the desired PWM period will be under algorithm control, rather than user control. For example, it is contemplated that the PWM period may be selected by system controller 30 to avoid interference with the reception of AM radio signals, for example by selecting the PWM period so that its harmonics are spaced from the frequency to which tuner 13 is currently tuned. System controller 30 may also dynamically vary the PWM period to implement "spread-spectrum" pulse-width modulation, to further reduce electromagnetic interference in the system and improve compatibility of digital audio receiver 10 with other nearby digital systems. Accordingly, it is contemplated that system controller 30 will be programmed to execute software routines for generating the control signals PWM_P(k) to PWM audio processor 20 to establish the desired PWM period of the output signals.

Figure 4:
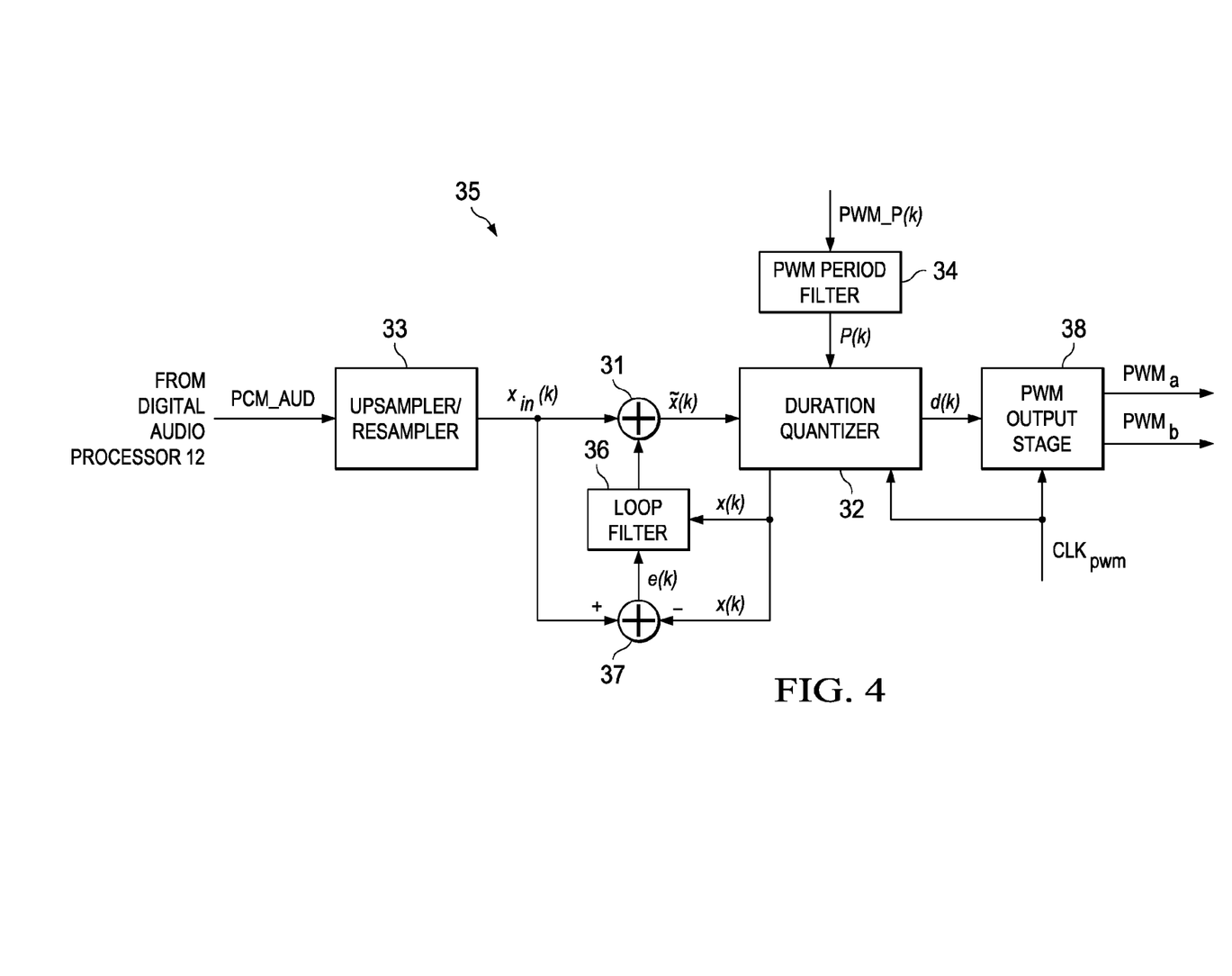
FIG. 4 is an electrical diagram, in block form, of modulation circuitry in an audio channel of the digital audio receiver of FIG. 3 according to the preferred embodiments of the invention.

FIG. 4 illustrates modulation circuitry 35 within PWM audio processor 20 for converting PCM signals from digital audio processor 12 into a pulse-width modulated signal, according to the preferred embodiment of the invention. The example of FIG. 4, and also the examples described in further detail below, will be described for a single audio channel, for the sake of clarity. It will be understood by those skilled in the art, having reference to this specification, that additional instances of the modulation circuitry 35 according to this preferred embodiment of the invention will be realized in a multiple-channel digital audio system, for modulating the signals used to drive each of the particular channels. In addition, modulation circuitry 35 shown in FIG. 4 will typically be implemented within a sequence of functions performed by PWM audio processor 20. As mentioned above, PWM audio processor 20 also preferably performs other signal processing functions, including one or more of controlling the audio output volume, parametric speaker equalization or "voicing", implementation of graphic equalizer presets, treble and bass adjustment, precision soft volume control, loudness compensation, noise squelch, channel synthesis, programmable dither, peak limiting and clipping, and other digital filter processing. It is contemplated that modulation circuitry 35 may be realized at any point within the data flow of PWM audio processor 20 including these other functions, depending on the domain (PCM or PWM) in which such processing is to be carried out. Given that the complex signal processing of modern digital audio processes is better suited for digital words that directly express amplitudes, it is contemplated that modulation circuitry 35 will be realized relatively late in the overall processing by PWM audio processor 20, perhaps as the last process before output of the signal to audio amplifiers 22.

As shown in FIG. 4, the PCM audio signal PCM_AUD from digital audio processor 12 is received (directly, or after additional processing as discussed above) at upsampler/resampler function 33. As will be evident from the following description, in some applications (e.g., spread-spectrum PWM) it is useful to resample the incoming PCM audio signal at a sampling rate consistent with the current PWM frequency; upsampling (e.g., by a factor of eight or sixteen) of the received PCM audio signal PCM_AUD simplifies this resampling. The output of upsampler/resampler 33 is presented to adder 31 of modulation circuitry 35 as PCM signal stream $x_{in}(k)$. Adder 31 combines this PCM signal stream $x_{in}(k)$ with the output of loop filter 36, as will be discussed later, to produce a sample stream $\tilde{x}(k)$ corresponding to the desired PCM sample values, prior to quantization, of the audio signal to be output for the channel. This sample stream $\tilde{x}(k)$ is applied to duration quantizer function 32, which also receives a signal P(k) indicative of the current desired PWM period at which the pulse-width modulated output signal is to be produced. Duration quantizer 32, as will be described in further detail below, produces a sequence of pulse segment duration values d(k), each duration value d(k) having a duration that is aligned within the clock grid. Specifically, the quantization levels applied by duration quantizer 32 are those duration values suitable for the current PWM period P(k) and that are integer multiples of the period of the master PWM clock $CLK_{pwm}$. The sequence of duration values d(k) produced by duration quantizer 32 in response to the received sequence of PCM values $x_{in}(k)$ is forwarded downstream in the data flow of PWM audio processor 20. In this example, PWM output stage 38, operating at the master PWM clock $CLK_{pwm}$, receives the duration sequence d(k) and produces complementary pulse-width modulated output signals $PWM_a$, $PWM_b$ that are applied to amplifier stage 22 for the audio channel.

Duration quantizer 32 also produces a feedback sample stream x(k). Each feedback sample value x(k) represents the PCM value corresponding to the quantized duration value d(k) output by duration quantizer 32. As such, quantization error is expressed as the difference between the PCM value $x_{in}(k)$ received from digital audio processor 12 and its corresponding feedback sample x(k) corresponding to the quantized duration d(k) output by quantizer 32 for that PCM value. Adder 37, in the arrangement of FIG. 4, generates error sample stream e(k) from the difference between the PCM value $x_{in}(k)$ and its corresponding feedback sample value x(k). Error sample stream e(k) is applied to loop filter 36, along with the feedback sample stream x(k) (directly, or indirectly after additional processing as will be described below); loop filter 36 applies noise shaping and sigma-delta filtering to the received input PCM sample stream $x_{in}(k)$ at adder 31, to generate sample stream $\tilde{x}(k)$ as discussed above.

Also as shown in FIG. 4, PWM period filter 34 receives control signal PWM_P(k) from system controller 30, and produces current period value P(k) for application to duration quantizer 32. The period values P(k) may be considered as numbers of cycles of the master PWM clock $CLK_{pwm}$; for example, a value P(k) of 64 with a master PWM clock frequency of 24.576 MHz will yield a PWM switching frequency $f_{sw}$ of 384 kHz. As will be described in more detail below, it has been discovered that digital filtering of the values of the desired PWM period P(k) can be useful in reducing the transient effects of changes in the desired PWM period, thus allowing abrupt or otherwise substantial changes in the PWM period, such as useful for spread-spectrum pulse-width modulation techniques.

The operation of modulation circuitry 35 in connection with an example of "AD2" modulation, or "two-sample consecutive edge PWM", will now be described. As mentioned above, AD2 refers to PWM modulation of a PCM sample stream in which the PCM samples are considered in pairs: one sample controls the position of the rising edge of the PWM pulse within one half of a PWM period, while the next sample controls the position of the falling edge of the PWM pulse within the other half of that PWM period. One can express a quantized duration sample value d(k) in terms of the desired PCM sample value $\tilde{x}(k)$ as follows:

$$d(k) = Q\left(\frac{1}{2}P(k) + \frac{(-1)^k}{4}(P(k)\tilde{x}(k) + P(k-1)x(k-1))\right) \quad (3)$$

The function Q indicates quantization of the calculated sample value for alignment with the clock grid of the current PWM period P(k). As evident, this expression includes the previous PCM sample value x(k−1) as well as the previous PWM sample period P(k−1). This equation (3) can be implemented within duration quantizer function 32 as will be described below. In addition, one can calculate the feedback PCM sample x(k) corresponding to this duration sample value d(k) by solving equation (3) for x(k) rather than $\tilde{x}(k)$ (and removing the quantization function Q):

$$x(k) = \frac{\frac{4}{(-1)^k}\left(d(k) - \frac{1}{2}P(k)\right) - P(k-1)x(k-1)}{P(k)} \quad (4)$$

This feedback sample value x(k), which is the PCM value corresponding to the corresponding quantized duration value d(k), is fed back to loop filter 36 to suppress quantization noise in the audio band.

Figure 5:
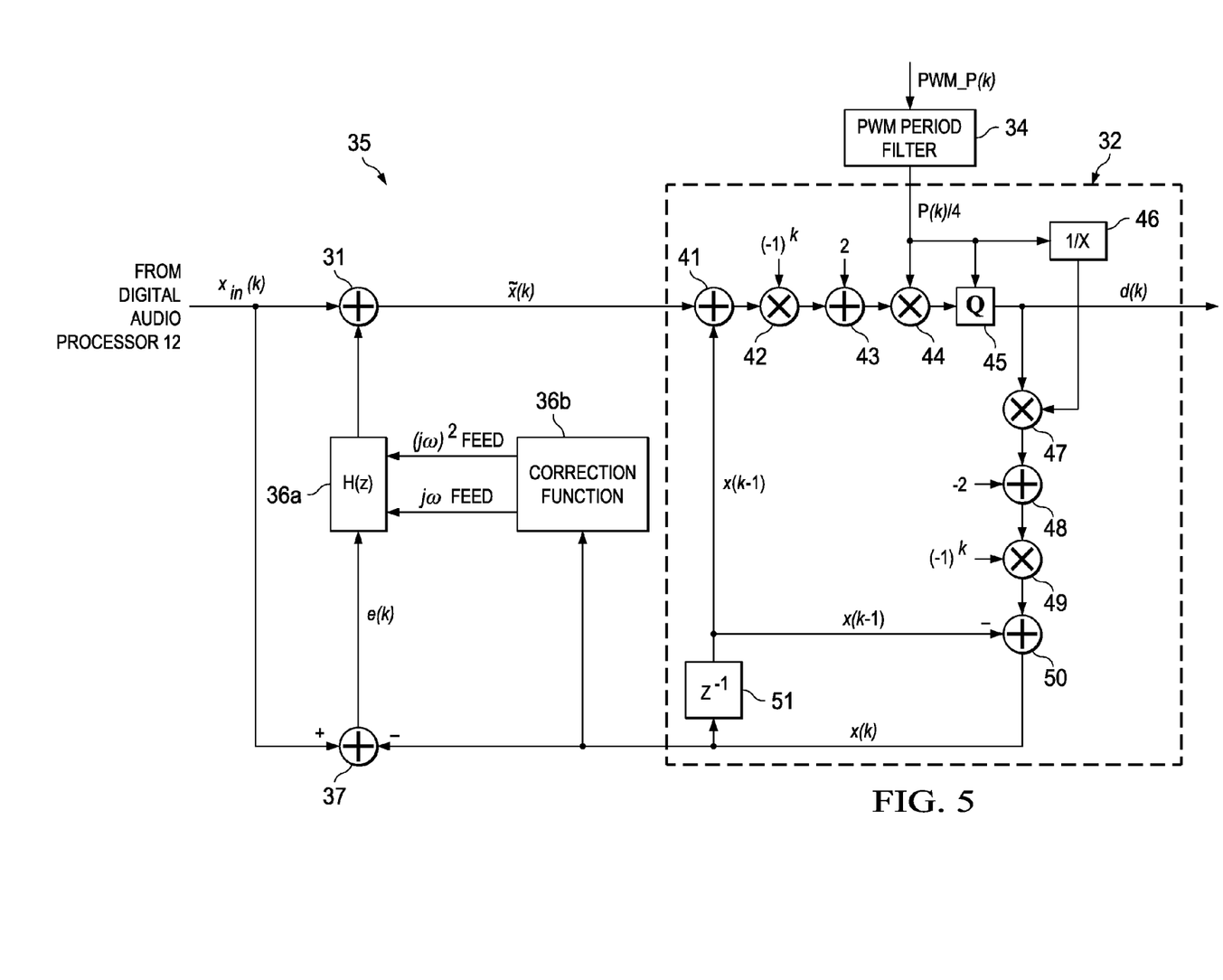
FIG. 5 is an electrical diagram, in block and schematic form, of modulation circuitry according to the block diagram of FIG. 4 according to a first preferred embodiment of the invention.

FIG. 5 illustrates an example of modulation circuitry 35 in further detail, as applied to AD2 modulation according to the preferred embodiment of the invention. The arrangement of FIG. 5 corresponds to that of FIG. 4, but includes the construction of duration quantizer function 32 and of part of loop filter 36 for this example of AD2 modulation, and according to an approximation of equations (3) and (4) discussed above. In this approximation, the previous PWM period value P(k−1) is set equal to the current PWM period value P(k), to ease the hardware requirements as will now be described. This results in modified equation (3') as follows:

$$d(k) = Q\left(\left(\frac{P(k)}{4}\right)[2 + (-1)^k(\tilde{x}(k) + x(k-1))]\right) \quad (3')$$

The approximation of P(k−1)=P(k) eliminates the necessity for a memory location to retain the previous PWM period value P(k−1); it is contemplated that performance of modulation circuitry 35 will deteriorate at most marginally, if at all, as a result of this approximation. Indeed, it has been observed, in connection with this invention, that the performance can improve by using the simplification of P(k−1)=P(k), because this simplification reduces errors caused by re-sampling the input and playing back at a non-uniform rate (e.g., according to the FM modulated PWM period). In this situation, it is believed that the error introduced by the simplification of P(k−1)=P(k) in part corrects for the error caused by non-uniform sampling and playback.

As shown in FIG. 5, duration quantizer function 32 receives the desired PCM sample value $\tilde{x}(k)$ at one input of adder 41, which adds the feedback sample value x(k−1) to the current desired PCM sample value $\tilde{x}(k)$. This sum $\tilde{x}(k)+x(k-1)$ is then multiplied by the $(-1)^k$ term at multiplier 42, and a digital value of 2 added to the product by adder 43. Multiplier 43 multiplies the output of adder 42 by a value corresponding to the current PWM period value P(k)/4, as produced by PWM period filter 34 in the manner described in detail below. The result produced by multiplier 44 is applied to quantizer 45, which in turn produces current quantized duration value d(k) at a selected one of a plurality of values corresponding to integer multiples of the PWM clock period. The sequence of quantized duration values d(k) thus produced fully defines a pulse-width modulated output signal useful for application to power stage 22 for the particular audio channel associated with modulation circuitry 35.

In effect, duration quantizer function 32 produces the duration value sequence d(k) at unity gain, and at a step size and number of steps that vary dynamically with the value of current PWM period P(k), applied by multiplier 44. This approach enables the PWM period P(k) to dynamically vary, while still producing duration values d(k) that are aligned with the PWM clock grid. This dynamic variation of the PWM period enables adaptive selection of the PWM period, for example to reduce interference with AM radio reception and also to implement spread-spectrum PWM for further reduction of interference. Quantization error resulting from the quantization of the duration value d(k) by quantizer 45 is suppressed according to this embodiment of the invention by calculating a PCM value x(k) from the quantized duration value d(k), and applying that calculated PCM value x(k) to loop filter 36.

As such, in this embodiment of the invention, duration quantizer function 32 produces feedback value x(k), which is a PCM value that corresponds to the quantized duration value d(k) at the output of quantizer 45. In this regard, the calculations of adders 41, 43 and multipliers 42, 44 are effectively reversed to derive feedback value x(k). Multiplier 47 multiplies the duration value d(k) by the reciprocal PWM period value 4/P(k) produced by reciprocal function 46. The digital value 2 is subtracted from this product by adder 48, and multiplier 49 multiplies the result by a $(-1)^k$ term. Adder 50 subtracts, from the result of multiplier 49, the previous feedback value x(k−1) as stored by memory location 51, thus producing feedback value x(k) at its output. This current feedback value x(k) is then itself stored by memory location 51 for use in the calculation of the next duration value d(k). This feedback value x(k) is also applied to adder 37 for generation of error value e(k), and to correction function 36b of loop filter 36.

As mentioned above, loop filter 36 performs noise shaping via a sigma-delta approach to suppress quantization noise in the audio band, according to this embodiment of the invention. In this regard, loop filter portion 36a applies a conventional noise shaping function of the desired order as a digital filter. For example, the transfer function H(z) applied by loop filter portion 36a may be a $4^{th}$ order noise shaping filter, without dither, that is applied to error sequence e(k), and which has been observed via simulation to provide excellent performance from the standpoint of audio band noise. Correction function 36b provides additional inputs into separate transfer functions of loop filter 36a to correct for other effects. As shown in FIG. 5, correction function 36b generates a jω term and a $(j\omega)^2$ term, both of which are applied to transfer functions in loop filter portion 36a for non-linear feedback correction, as known in the art. These feed-in nodes to loop filter portion 36a apply jω and $(j\omega)^2$ transfer functions to the quantized PCM output node, which in this case is the x(k) feedback signal. Consequently, the entire closed-loop has to be taken into consideration in deriving the H(z) block. When closing the loop, the quantizer is preferably modeled as a unity gain block (with a quantization error source), according to conventional sigma-delta theory. An example of such non-linear feedback correction in a PCM-to-PWM modulation and suitable for use in connection with this embodiment of the invention is described in U.S. Pat. No. 6,657,566 B1, incorporated herein by reference. It is contemplated that other conventional non-linear feedback correction can similarly be applied. More specifically, distortion inherent from AD2 modulation appears as second-order sidebands around the PWM frequency; according to a preferred embodiment of the invention, the jω term produced by correction function 36b includes a squaring of the feedback value x(k) and multiplication by a $(-1)^k$ term. The $(j\omega)^2$ term applied to a transfer function in loop filter 36a helps suppress harmonic distortion, in the conventional manner. As described in the above-incorporated U.S. Pat. No. 6,657,566 B1, the jω and $(j\omega)^2$ terms need only be approximated, in order to attain acceptable correction.

It has been observed, through simulation, that modulation circuitry 35 according to this embodiment of the invention enables the use of "spread-spectrum" pulse-width modulation, by way of which the PWM period varies with time. For example, if the PWM period P(k) were to vary sinusoidally at a frequency $f_m$:

$$P(k)=P(0)(1+A_m \sin(2\pi f_m k)) \quad (5)$$

samples of the input signal $x_{in}(k)$ are preferably acquired at non-uniform times $t_s(k)$:

$$t_s(k) = \frac{1}{2}\sum_{n=0}^{k} P(n) \quad (6)$$

As mentioned above, upsampler/resampler function 33 would thus preferably sample the input PCM signal also at these non-uniform times $t_s(k)$ that depend on the current PWM period. For an input sine wave at an amplitude $A_a$ and a frequency $f_a$, the sampled PCM signal $x_{in}(k)$ would follow:

$$x_{in}(k)=A_a \sin(2\pi f_a t_s(k)) \quad (7)$$

It has been observed, through simulation, that modulation at amplitudes $A_m$ ranging from 3% up to 20%, at relatively low modulation frequencies (e.g., below 100 Hz) can be applied to the PWM period values P(k) without significantly affecting the audio-band performance of the output PWM signal generated from duration sequence d(k) generated by modulation circuitry 35 described above. This ability of modulation circuitry 35 to produce a PWM output signal at such wide variations in PWM period enables the use of "spread-spectrum" pulse-width modulation, spreading harmonic interference from the PWM clock and PWM switching events over a wide range of frequencies, thus reducing the effect of such interference.

In addition to the continuously variable "spread-spectrum" PWM approach in which the PWM period is constantly changing, changes in the PWM period are also useful in changing the PWM period from one fixed rate to another. For example, because harmonics of the PWM frequency can cause interference with the receipt of AM radio signals, it can be useful to change the PWM frequency in response to changes in the AM radio frequency to which the receiver is being tuned. Such changes in the AM radio frequency, and thus in the PWM frequency, can be quite abrupt. Accordingly, it is useful to suppress transient behavior caused by such abrupt changes in the PWM period. A signal model of the audio band transients resulting from abrupt changes in the PWM period value P(k) is useful in deriving such suppression, as will now be described.

As discussed above, a pulse-width modulated signal is uniquely definable by way of its sequence of transition times t(k). If one of these transition times is perturbed (i.e., earlier or later in time than its true value), the perturbation in amplitude of the signal will be ±2 (with the sign depending on whether the perturbation anticipates or lags the true transition time) because, during the errored time, the PWM signal will be at its opposite state. The duration of the ±2 amplitude perturbation pulse is equal to the time of the perturbation. This error event can be expressed by a PCM sample having a value proportional to the area of the error pulse (duration times amplitude); more specifically, one can express the error as the area of the error pulse times the sample rate of the PCM signal (i.e., which is twice the PWM rate $f_{sw}$ in this AD2 situation), and in the form of a PCM perturbation sequence $\Delta x(k)$:

$$\Delta x(k) = \Delta t(k) \cdot 2(-1)^k 2 f_{sw} = \Delta t(k) \cdot 4(-1)^k f_{sw} \quad (8)$$

where $\Delta t(k)$ expresses a time perturbation sequence. In effect, equation (8) is a simple first order PWM-to-PCM conversion model. For the case of AD2 modulation in which the transition sequence t(k) has no signal modulation but follows a dynamic period width P(k):

$$t(k) = \sum_{n=0}^{k} P(n) \quad (9a)$$

a time perturbation sequence can be expressed from differences in the dynamic PWM period P(k) from a nominal period $P_0$:

$$\Delta t(k) = \sum_{n=0}^{k} (P(n) - P_0) \quad (9b)$$

which, through operation of equation (8), defines a PCM perturbation sequence:

$$\Delta x(k) = 4 f_{sw}(-1)^k \sum_{n=0}^{k} (P(n) - P_0) \quad (10)$$

Because the nominal period $P_0$ is merely a DC contribution that is integrated by the summation, but which is "flipped" to the PCM sample frequency $2f_{sw}$ (i.e., the Nyquist rate for the PWM sample stream at its switching frequency $f_{sw}$) by virtue of the multiplication with the $(-1)^k$ term, and because the frequency region of interest is only the low frequency behavior of the PCM signal, this equation (10) can be expressed as:

$$\Delta x(k) \cong 4 f_{sw}(-1)^k \sum_{n=0}^{k} (P(n)) \quad (10')$$

Equation (10') can be shown by the signal model of FIG. 6a, in which the summation term is replaced by a discrete integrator digital filter function 60. Multiplier 61 then multiplies the result of the integration by the $(-1)^k$ term, the product of which is amplified by amplifier 62 with a gain of $4f_{sw}$.

Figure 6B:
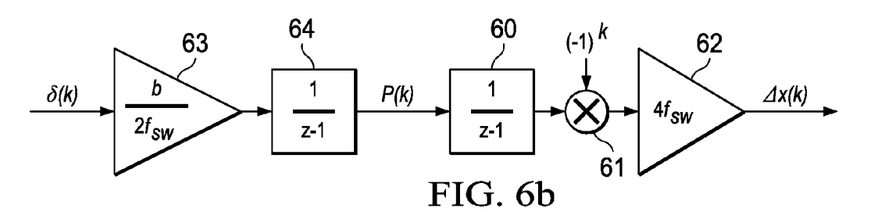
Figure 6C:
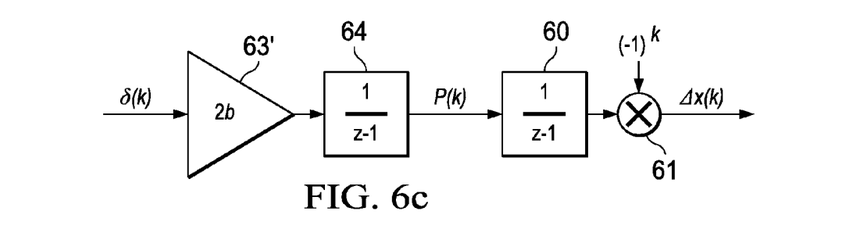

It is useful to consider the effect of an abrupt change b in the PWM period, as reflected in a perturbation sequence $\Delta x(k)$. FIG. 6b illustrates a signal model for such a perturbation, considering that a delta pulse $\delta(k)$ followed by integration corresponds to a step function reflected in the PWM period sequence P(k); FIG. 6b illustrates this abrupt change b by way of a delta impulse amplified by a factor $b/2f_{sw}$ via amplifier 63, and integrated by integrator 64. This signal model of FIG. 6b assumes a relatively small value of b, for example a 10% change in PWM period. FIG. 6c further simplifies this signal model by combining amplifiers 62, 63 into amplifier 63', with a gain of 2b; amplifier 63 is then eliminated. As such, the delta impulse is multiplied by a factor of 2b, and integrated twice, before being spectrally "flipped" by multiplier 61 and the $(-1)^k$ term. Each of integrators 64, 60 apply a gain of ½ at the Nyquist frequency of sequence $\Delta x(k)$, which is the PWM switching rate $f_{sw}$, arriving at a composite gain of ¼ at the Nyquist frequency. According to this signal model, the PCM perturbation sequence $\Delta x(k)$ resulting from an abrupt step change of magnitude b (relative step size) in the PWM period P(k) can be approximated by a delta impulse of amplitude b/2, which of course exhibits a "white" or wideband spectrum. One can equivalently consider this delta impulse of amplitude b/2 as a continuous-time pulse waveform of unity amplitude, and a duration of $b/4f_{sw}$ (i.e., b/2 over one-half of a PWM switching period).

This white spectrum PCM perturbation due to an abrupt change in PWM period of course inserts noise energy into the audio band (i.e., below 20 kHz). It has been observed that noise levels at −120 dB or so, in typical modern digital audio systems, is at the margin of audibility. Accordingly, it is desirable to suppress transient noise in the audio band to a level of −120 dB or less.

According to the preferred embodiment of the invention, referring back to FIG. 4, PWM period filter 34 is provided to provide such suppression, by way of a digital filter applied to the control signals PWM_P(k) applied to modulation circuitry 35, for example by system controller 30 (FIG. 3). Based on the signal models discussed above relative to equations (8) through (10'), spectral components near the Nyquist frequency of the PCM signal will be "flipped" into the lower frequency audio band, considering that the Nyquist frequency of the PCM signal is exactly the PWM switching rate (i.e., there are two PCM samples for every PWM period). This relationship is used to advantage by constructing PWM period filter 34 as a $K^{th}$ order low-pass filter with zeroes at the Nyquist frequency (z=−1), and unity gain:

$$H_k(z) = \frac{(z+1)^K}{2^K} \quad (11)$$

The order K selected for filter 34 is preferably selected according to a tradeoff between noise suppression and the number of samples of period P(k) over which the abrupt change will be spread.

It is contemplated that this approach will successfully attain suppression of audio band noise caused by abrupt change in the PWM period to such levels as to not be audible. Accordingly, it is contemplated that PWM audio processor 20 according to this preferred embodiment of the invention will be able to generate PWM signals corresponding to the processed audio output at a PWM frequency selected to avoid interference with AM radio reception. The selection of the PWM period may be made, for example, by way of an algorithm stored in program memory available to system controller 30, by way of which a PWM period is retrieved from memory or calculated in response to the current AM frequency to which tuner 13 is tuned. Furthermore, it is contemplated that this noise suppression may also be implemented by dynamically varying the PWM period, for example according to a "spread-spectrum" PWM approach, for example in a "frequency-hopping" manner. This spreading of the PWM period over a range of frequencies will, of course, reduce interference energy at sensitive frequencies used elsewhere in digital audio receiver 10.

The foregoing description of PWM audio processor 20 and modulation circuitry 35 was provided for the case of AD2 modulation, in which a pair of PCM pulses defined a single PWM pulse by specifying its rising and falling edge times. It is also contemplated that this invention may be applied to "AD1" modulation, in which each PCM pulse defines a PWM pulse of specified duration and centered about the midpoint of the PWM period. This allows a single PCM value to fully define a corresponding PWM pulse. AD1 modulation is advantageous in that the noise shaping loop filter and other signal processing can run at one-half the sample rate of that necessary for AD2 modulation; specifically, this signal processing can run at the switching rate $f_{sw}$ of the PWM modulation, rather than at twice that rate. However, the computational complexity involved in the PCM-to-PWM conversion is effectively doubled for AD1 modulation relative to AD2 modulation; in addition, poorer performance from a noise standpoint is inherent with PWM modulation according to the AD1 scheme. It is contemplated that those skilled in the art having reference to this specification will be readily able to apply such modulation in connection with this invention. An example of the application of the preferred embodiments of the invention in an AD1 context will now be described.

Under AD1 modulation, a PCM value x(k) defines the transition times $t_r(k)$ and $t_f(k)$ of rising and falling edges, respectively, of the PWM pulse of period P(k) as follows:

$$t_r(k) = \sum_{n=0}^{k-1} P(n) - \frac{P(k)}{4}(x(k)+1)) \quad (12)$$

$$t_f(k) = \sum_{n=0}^{k-1} P(n) + \frac{P(k)}{4}(x(k)+1))$$

As mentioned above, however, AD1 modulation involves the constraint that the PWM pulse is symmetrically placed within the PWM period about the midpoint of that period. According to this embodiment of the invention, the rising and falling edge transition times $t_r(k)$ and $t_f(k)$, respectively, can be expressed by corresponding rising and falling edge PCM samples $x_r(k)$, $x_f(k)$:

$$t_r(k) = \sum_{n=0}^{k-1} P(n) - \frac{P(k)}{4}(x_r(k)+1)) \quad (13)$$

$$t_f(k) = \sum_{n=0}^{k-1} P(n) + \frac{P(k)}{4}(x_f(k)+1))$$

These expressions lead to an expression for the PWM pulse segment duration values $d_r(k)$ and $d_f(k)$ as follows:

$$d_r(k) = t_r(k) - t_f(k-1) \quad (14a)$$
$$= \frac{1}{4}[P(k-1) \cdot (1 - x_f(k-1)) + P(k) \cdot (1 - x_r(k))]$$
$$= \frac{1}{4}[P(k-1) + P(k) - P(k-1) \cdot x_f(k-1) - P(k)(x_r(k))]$$

and:

$$d_f(k) = t_f(k) - t_r(k) \quad (14b)$$
$$= \frac{P(k)}{4}(2 + x_r(k) + x_f(k))$$

According to the preferred embodiment of the invention, as in the case of AD2 modulation, each duration value is quantized so that its edges are aligned with integer multiples of the master PWM clock. According to this embodiment of the invention for AD1 modulation, separate rising and falling edge duration values $d_r(k)$, $d_f(k)$ are generated. The duration value $d_r(k)$ for the first half-period is:

$$d_r(k) = \quad (15)$$
$$Q\left[\frac{1}{4}(P(k) + P(k-1) - P(k) \cdot \tilde{x}(k) - P(k-1) \cdot x_f(k-1))\right]$$

where $\tilde{x}(k)$ is, again, the desired PCM sample value corresponding to the desired duration of the PWM pulse. The duration value $d_r(k)$ corresponds to the duration of the PWM pulse prior to the midpoint of the PWM period, while the duration value $d_f(k)$ corresponds to the duration of the PWM pulse following the midpoint of the PWM period. Equation (15) indicates that the previous falling edge PCM value $x_f(k-1)$ must be stored in memory from one sample to the next. As before, the PCM value $x_r(k)$ corresponding to that value can be determined from the quantized duration value $d_r(k)$, for use as a feedback sample value:

$$x_r(k) = -\frac{4d_r(k) - P(k) - P(k-1)(1 - x_f(k-1))}{P(k)} \quad (16)$$

Ideally (i.e., with no quantization error), the duration $d_f(k)$ of the second half of the PWM pulse defined by equation (14b) can be expressed as:

$$d_f(k) = \frac{P(k)}{4}(2 + 2\tilde{x}(k)) \quad (17)$$

But because quantization of the pulse duration to align with the PWM master clock is required, the duration $d_f(k)$ of the second half of the PWM pulse is properly expressed as:

$$d_f(k) = Q\left[\frac{P(k)}{4}(2 + 2\tilde{x}(k))\right] \quad (18)$$

This equation (18) permits the PCM value $x_f(k)$ corresponding to the quantized duration value $d_f(k)$ to be determined, for use as a feedback sample value:

$$x_f(k) = \frac{P(k)}{4}d_f(k) - 2 - x_r(k) \quad (19)$$

These equations, particularly equations (15) and (18) for the calculation of quantized duration values $d_r(k)$, $d_f(k)$, respectively, and equations (16) and (19) for the calculation of the corresponding feedback PCM values $x_r(k)$, $x_f(k)$, respectively, can be readily implemented into the modulation data flow, for example by way of program instructions executable by digital signal processor 26 (FIG. 3), by way of logic hardware, or a combination of the two.

Figure 7:
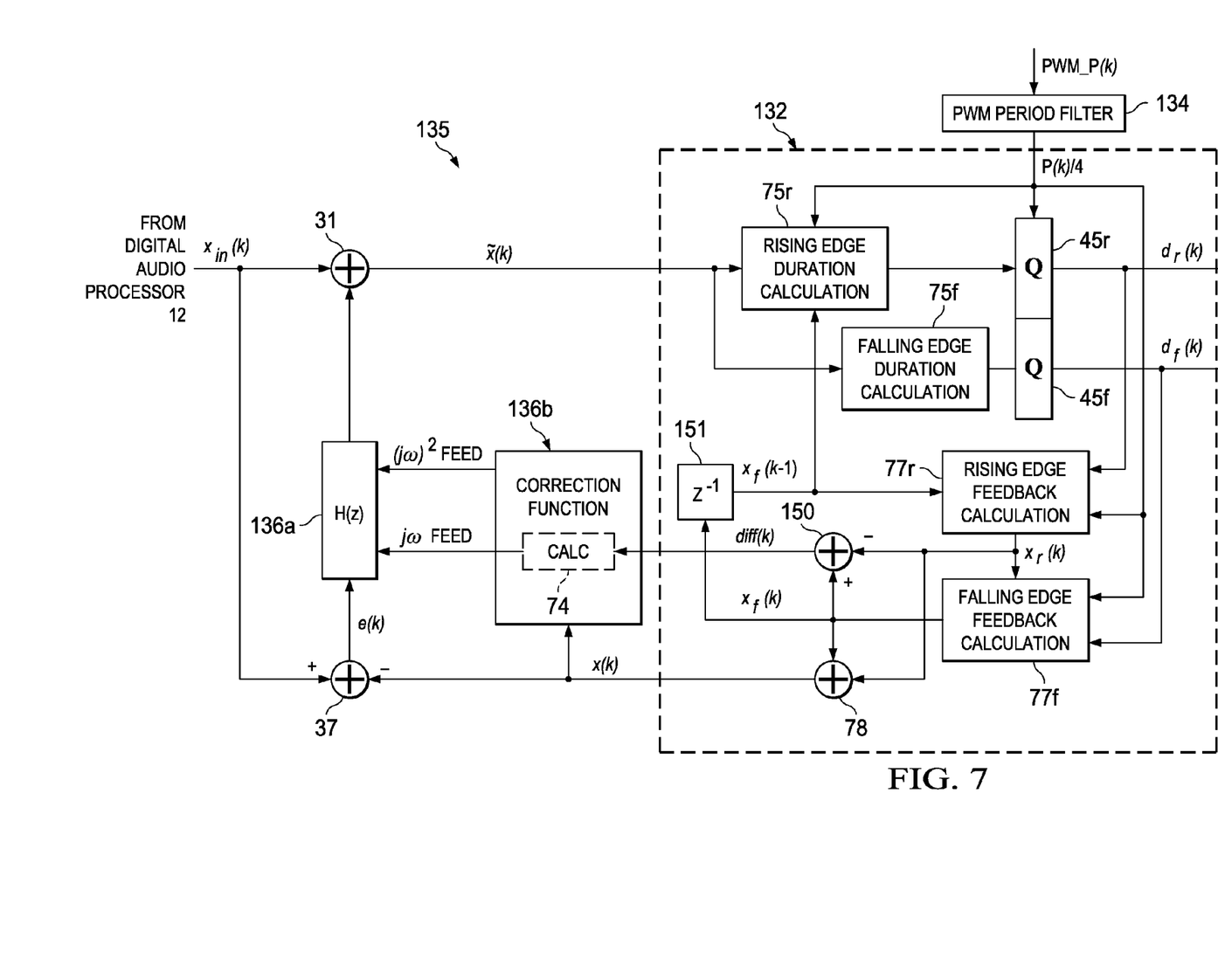
FIG. 7 is an electrical diagram, in block and schematic form, of modulation circuitry according to second and third preferred embodiments of the invention.

FIG. 7 illustrates, in block and schematic form, the construction of modulation circuitry 135 according to another preferred embodiment of the invention, as implemented for PCM-to-PWM conversion according to AD1 modulation. Those elements of FIG. 7 that also appear in FIG. 5 are referred to by the same reference numerals, and will not be further described herein.

As shown in FIG. 7, modulation circuitry 135 includes circuitry for producing two duration values $d_r(k)$ and $d_f(k)$ from each incoming PCM value $\tilde{x}(k)$. Each of the duration values $d_r(k)$ and $d_f(k)$ are quantized, by respective quantizers 45r, 45f to be aligned with the clock grid of the master PWM clock, specifically by being quantized to integer multiples of the high-speed PWM clock period. As discussed above, the duration value $d_r(k)$ indicates the duration of the PWM pulse from its rising edge to the midpoint of the PWM period, and duration value $d_f(k)$ indicates the duration of the PWM pulse from the midpoint of the PWM period to its falling edge. The active portion of the PWM pulse thus has a duration corresponding to the sum of duration values $d_r(k)$ and $d_f(k)$, and is nominally centered about the midpoint of the PWM period. As evident from this description, of course, the PWM period P(k) may be varying over time, causing asymmetry in the PWM pulse relative to the midpoint of the PWM period; in addition, quantization or other effects may also cause asymmetry of the PWM pulse. The effects of such asymmetry are preferably suppressed by loop filter 136a, 136b, as will be described below.

Modulation circuitry 135 includes separate calculation functions 75r, 75f for deriving duration values for the rising and falling edge durations, respectively, prior to quantization by quantizers 45r, 45f, respectively. Rising edge calculation function 75r and quantizer 45r, in combination, implement calculations corresponding to equation (15) described above, while the combination of falling edge duration calculation function 75f and its quantizer 45f implement calculations corresponding to equation (18) described above. As evident from the equation (15) and from FIG. 7, rising edge duration calculation function 75r receives the desired PCM value $\tilde{x}(k)$ from adder 31, the current PWM period value P(k) (in this example, divided by four) from PWM period filter 134, and also a previous value of the falling edge feedback value $x_f(k-1)$ from the prior period, as stored in memory location 151. Similarly, falling edge duration calculation function 75f receives the desired PCM value $\tilde{x}(k)$ from adder 31 and the current PWM period value P(k) (in this example, divided by four) from PWM period filter 134, consistent with equation (18). The simplification of P(k)=P(k−1) may also be applied by calculation functions 75r, 75f if desired, as suggested by FIG. 7; alternatively, a memory location may be provided to store the previous PWM period value P(k−1). Duration values $d_r(k)$ and $d_f(k)$ are then presented at the output of quantizers 45r, 45f, respectively, for use in generating the PWM pulse sequence applied to the output stage 22 for the channel, in the manner described above.

Modulation circuitry 135 also produces a corresponding pair of feedback PCM values $x_r(k)$, $x_f(k)$ from quantized duration values $d_r(k)$, $d_f(k)$, respectively. In the arrangement shown in FIG. 7, rising edge feedback calculation function 77r receives quantized duration value $d_r(k)$, and generates feedback PCM value $x_r(k)$ substantially reversing the calculations carried out by rising edge duration calculation function 75r, according to equation (16) described above. Falling edge feedback calculation function 77f receives quantized duration value $d_f(k)$ and feedback PCM value $x_r(k)$, and generates feedback PCM value $x_f(k)$ according to equation (19) above; this feedback PCM value $x_f(k)$ is stored in memory location 151 for use in generation of the next sample values, as discussed above. Adder 78 adds feedback PCM values $x_r(k)$, $x_f(k)$ to produce feedback value x(k) that is applied to adder 37 to produce error sample value e(k) for application to loop filter portion 136a. Also according to this embodiment of the invention, adder 150 produces a sequence of difference values diff(k) that corresponds to the difference between feedback PCM values $x_r(k)$, $x_f(k)$. This difference sequence diff(k) reflects the asymmetry of the output PWM pulse relative to the midpoint of the PWM period.

It is contemplated that those skilled in the art having reference to this specification will be readily able to implement the appropriate calculation functions 75r, 75f, 77r, 77f, without undue experimentation either by way of software instructions executable by a digital signal processor or the like, or by way of logic hardware, or a combination of the two. As mentioned above, simplifications or approximations may be made in such calculations to improve calculation efficiency, at a cost of signal fidelity.

Correction function 136b receives feedback value x(k) and difference signal diff(k), and produces outputs corresponding to a jω term and a (jω)² term that are applied to respective separate transfer functions in loop filter 136a to correct for other effects, similarly as discussed above relative to FIG. 5. As before, correction function 136b generates a (jω)² feedback term that is applied to loop filter portion 136a for correction of harmonic distortion in the conventional manner. Calculation function 74 in correction function 136b derives a jω term from feedback difference value diff(k). As mentioned above, each difference value diff(k) corresponds to the asymmetry of the PWM pulse relative to the midpoint of the PWM period, as an asymmetry factor that is scaled with the PWM pulse duration. This jω term generated by calculation function 74 in correction function 136b is applied to loop filter portion 136a, for correction of asymmetry in the PWM signal by loop filter portion 136a. As discussed above, the entire closed loop including these jω and (jω)² transfer functions ought to be taken into consideration in deriving the H(z) block of loop filter portion 136a. Preferably, for this purpose, the quantizer is preferably modeled as a unity gain block (with a quantization error source), according to conventional sigma-delta theory. It is contemplated that those skilled in the art having reference to this specification will be readily able to implement the appropriate loop filter portion 136a and correction function 136b for correction of quantization error, asymmetry, harmonic distortion and other effects in the system. As mentioned above and as described in the above-incorporated U.S. Pat. No. 6,657,566 B1, these jω and (jω)² terms need only be approximated to attain acceptable correction.

Similarly as discussed above, it is contemplated that PWM period filter 134 can be arranged to suppress transient effects of abrupt changes in the desired PWM period value P(k). In this AD1 modulation situation, however, the period sequence values P(k) are at a sample rate of one-half that in AD2 modulation, considering that each input PCM sample value x̃(k). As a result, it has been discovered, according to this invention, that the signal model for the PCM perturbation sequence Δx(k) can be expressed as a double-differentiation of the PWM period sequence P(k), with a half period delay because the period sequence P(k) is defined at the boundaries of the PWM period while the corresponding PCM perturbation sequence Δx(k) is centered within the PWM period (amounting to a half-period delay). As such, a step in the PWM period value P(k) results in a transient with a first-order high-pass spectrum. And because noise in the audio band is of most interest for this application, the symmetrical AD1 modulation scheme itself inherently provides a first order reduction of clicks and pops due to abrupt changes of the PWM period.

However, if the PWM period includes a period modulation (i.e., an AC component in the P(k) sequence), the frequency of this modulation is demodulated directly into baseband in the PWM output. While the second-order differentiation in the signal model causes this demodulation to only be significant for higher modulation frequencies (e.g., 5 kHz to 20 kHz), this source of error is not present in AD2 modulation because the PWM period values P(k) are sampled twice per PWM period. It is possible to correct this error due to dynamic change of the PWM period by deriving a correction signal added into the PCM input sequence x̃(k), but to do so is tedious in practice. According to another preferred embodiment of this invention, the observation that this demodulation error is not present in AD2 modulation is used to advantage by effectively controlling the period value P(k) twice in each PWM period, as will now be described.

According to this embodiment of the invention, advancing of the PWM period sequence P(k) to a sample rate of twice the PWM period enables independent control of the spectral components of the sequence in the low frequency band separately from the spectral components near the switching rate (Nyquist frequency). This not only enables click and pop suppression in the audio band, but also the FM demodulation of the modulation frequency into the audio band as described above. It is contemplated that this double-sampling of the PWM period values P(k) can be implemented simply by oversampling the control signal PWM_P(k) from system controller 30 by a factor of two, or by system controller 30 or another logic function issuing the sequence of PWM period sample values at a doubled frequency.

This approach considers the PWM period values as having a value P(2k) for the first half of the $k^{th}$ PWM frame, and a value of P(2k+1) for the second half of that $k^{th}$ PWM frame. Accordingly, the PWM pulse for period k can be defined by its transition times as:

$$t_r(k) = \frac{1}{2}\sum_{n=0}^{2k} P(n) - \frac{P(2k)}{4}(x_r(k)+1) \quad (20)$$

$$t_f(k) = \frac{1}{2}\sum_{n=0}^{2k} P(n) - \frac{P(2k+1)}{4}(x_f(k)+1)$$

This results in pulse duration sequences:

$$d_r(k) = t_r(k) - t_f(k-1) \quad (21)$$
$$= \frac{P(2k)}{4}(1-x_r(k)) + \frac{P(2k-1)}{4}(1-x_f(k-1))$$

$$d_f(k) = t_f(k) - t_r(k) \quad (22)$$
$$= \frac{P(2k)}{4}(1+x_r(k)) + \frac{P(2k+1)}{4}(1+x_f(k))$$

Of course, as shown in FIG. 7, these duration values $d_r(k)$, $d_f(k)$ are quantized values. For example, rising edge duration value $d_r(k)$ can be expressed as:

$$d_r(k) = Q\left[\frac{P(2k)}{4}(1-\tilde{x}(k)) + \frac{P(2k-1)}{4}(1-x_f(k-1))\right] \quad (23)$$

From this quantized duration value $d_r(k)$, one can derive the corresponding feedback value $x_r(k)$:

$$x_r(k) = 1 - \frac{4}{P(2k)}\left(d_r(k) - \frac{P(2k-1)}{4}(1-x_f(k-1))\right) \quad (24)$$

An idealized duration value $\tilde{d}_f(k)$ is now definable:

$$\tilde{d}_f(k) = \frac{P(2k)}{4}(1+\tilde{x}(k)) + \frac{P(2k+1)}{4}(1+\tilde{x}(k)) \quad (25)$$
$$= \left(\frac{P(2k)}{4} + \frac{P(2k+1)}{4}\right)(1+\tilde{x}(k))$$

Quantization of this ideal segment length leads to:

$$d_f(k) = Q\left[\left(\frac{P(2k)}{4} + \frac{P(2k+1)}{4}\right)(1+\tilde{x}(k))\right] \quad (26)$$

From which the corresponding PCM feedback value $x_f(k)$ can be solved:

$$x_f(k) = \frac{4}{P(2k+1)}\left(d_f(k) - \frac{P(2k)}{4}(1+x_r(k))\right) - 1 \quad (27)$$

These calculations of equations (23), (24), (26), and (27) can be implemented into calculation functions 75r, 75f, 77r, 77f of modulation circuitry 135 shown in FIG. 7, in order to implement the double-sampling of the PWM period described above. Such implementation is contemplated to be within the ordinary skill of one in the art, having reference to this specification, and without undue experimentation; as before, these calculations can be implemented by way of program instructions executable by a digital signal processor or other programmable logic, or by way of custom logic hardware, or a combination of the two. As mentioned above, this double-sampling will eliminate the demodulation into baseband of the frequency at which the PWM period is modulating, while also suppressing clicks and pops in the audio band resulting from PWM period changes.

PWM period filter 134 can be arranged to further suppress the effects of dynamic changes in the PWM period P(2k) according to this double-sampling embodiment of the invention. It can be readily observed, from equations (23) and (26), that the pulse segment durations $d_r()$, $d_f(k)$ converge to the mean value of the present and past PWM period values, for a PCM input signal $\tilde{x}(k)=0$. This averaging corresponds to digital filtering of PWM period P(k) with a transfer function H(z):

$$H(z) = \frac{1+z^{-1}}{2} \quad (28)$$

which corresponds to a DC gain of unity and a zero at the Nyquist frequency. PWM period filter 134 can thus be realized as a $K^{th}$ order digital filter, with K=1 or more zeroes at the Nyquist frequency. Such filtering of the PWM period sequence P(k) will further reduce error in the audible band, as described above in the implementation of FIG. 5.

According to the preferred embodiments of the invention, the conversion of a pulse-code modulated (PCM) signal to a pulse-width modulated (PWM) signal is achieved without the constraints on the PWM period present in conventional modulators. According to this invention, the PWM period can be selected over effectively a continuous range, without being constrained to integer multiples of the master high-speed PWM clock period. Rather, the current desired PWM period is used to calculate a quantized duration sequence for the PWM pulses; recalculation of PCM values corresponding to the quantized duration values provides feedback values that are applied to the incoming PCM signal for noise suppression. In addition, relatively simple digital filtering of the sequence of PWM period values suppresses noise in the audio band resulting from abrupt changes or modulation of the PWM period.

This ability to select or vary the PWM period to which a PCM signal is modulated is especially beneficial in some applications, such as digital audio systems. The PWM period can be selected to avoid the generation of harmonics that can interfere with AM radio reception; indeed, this selection of the PWM period can be made in response to the currently tuned AM frequency. The effects of PWM interference on the audio processing can also be reduced, according to this invention, by modulating the PWM frequency according to a "spread-spectrum" pulse-width modulation approach, thus spreading the interfering energy over a wide frequency band.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of generating a pulse-width modulated (PWM) signal from a pulse-code modulated (PCM) input signal, comprising the steps of:
   receiving a sequence of PCM sample values;
   generating a sequence of PWM period values corresponding to a first desired PWM period;
   for each of a plurality of PWM pulses in sequence, generating a quantized duration value responsive to a corresponding PCM sample value and to a corresponding PWM period value, the quantized duration value indicating a duration of the PWM pulse, quantized to an integer multiple of a master PWM clock period;
   generating a feedback PCM value corresponding to each quantized duration value; and
   adjusting each of the received PCM sample values responsive to a corresponding feedback PCM value, before the step of generating the quantized duration value.

2. The method of claim 1, further comprising:
   then selecting a second desired PWM period value;
   filtering the sequence of PWM period values including those PWM period values corresponding to the first and second desired PWM periods; and
   repeating the generating and adjusting steps using the filtered PWM period values.

3. The method of claim 2, wherein the filtering step comprises applying a $K^{th}$ order low-pass digital filter to the sequence of PWM period values.

4. The method of claim 3, further comprising:
   repeating the selecting, filtering, and repeating steps;
   wherein the repeated step of selecting the second desired PWM period value comprises modulating the desired PWM period value at a modulation frequency.

5. The method of claim 3, wherein the step of selecting the second desired PWM period value comprises selecting the second desired PWM period responsive to a current AM radio tuning frequency.

6. The method of claim 1, wherein the step of generating the quantized duration value comprises:
   calculating a duration value from the adjusted PCM sample value using the corresponding PWM period value; and
   quantizing the duration value to a selected one of a plurality of quantization values corresponding to integer multiples of the master PWM clock period.

7. The method of claim 1, wherein the step of adjusting each of the received PCM sample values comprises:
   generating an error signal responsive to a received PCM sample value and the feedback PCM value;
   applying a digital filter to the error signal to produce a correction value; and
   for each sample value of the received PCM signal, applying the correction value to produce an adjusted PCM signal value.

8. The method of claim 1, wherein two PCM sample values are received for each PWM period;
   further comprising:
   storing a most recent feedback PCM value in a memory location;
   and wherein the step of generating a quantized duration value also uses the stored most recent feedback PCM value.

9. The method of claim 1, wherein one PCM sample value is received for each PWM period;

wherein the step of generating a quantized duration value comprises:
   generating a rising edge quantized duration value responsive to the PCM sample value and to a corresponding PWM period value, the quantized duration value indicating a duration of a first portion of the PWM pulse in a PWM period, quantized to an integer multiple of the master PWM clock period; and
   generating a falling edge quantized duration value responsive to the PCM sample value and to the corresponding PWM period value, the quantized duration value indicating a duration of a second portion of the PWM pulse in a PWM period, quantized to an integer multiple of the master PWM clock period;
wherein the step of generating a feedback PCM value comprises:
   generating a rising edge feedback PCM value corresponding to the rising edge quantized duration value and to a falling edge PCM feedback value from a previous PWM period;
   generating a falling edge feedback PCM value corresponding to the falling edge quantized duration value and to the rising edge feedback PCM value; and
   combining the rising edge feedback PCM value and the falling edge feedback PCM value to generate the feedback PCM value.

10. The method of claim 1, wherein the generating and adjusting steps are performed by operating programmable digital signal processor logic according to program instructions stored in a program memory.

11. Modulation circuitry for producing a pulse-width modulated (PWM) signal responsive to a received pulse-code modulated (PCM) input signal, comprising:
   a duration quantizer, having an input receiving a control signal indicative of a current PWM period value, having an input receiving an input corresponding to the received PCM input signal, for producing a quantized pulse duration value responsive to the input signal for the current PWM period value;
   wherein the duration quantizer quantizes the pulse duration value to an integer multiple of a master PWM clock;
   wherein the duration quantizer is also for producing a feedback PCM value corresponding to the quantized pulse duration value;
   an error circuit for producing an error signal responsive to the received PCM input signal and to the feedback PCM value;
   a loop filter for filtering the error signal; and
   circuitry for modifying the received PCM input signal applied to the duration quantizer responsive to an output of the loop filter.

12. The circuitry of claim 11, further comprising:
a PWM period filter, for filtering received signals indicating desired PWM period values to produce the control signal indicative of a current PWM period value.

13. The circuitry of claim 11, further comprising:
program memory, for storing program instructions that, when executed by programmable logic, produce a pulse duration value responsive to an input current PWM period value that is quantized to an integer multiple of a master PWM clock, and produce a feedback PCM value corresponding to the quantized pulse duration value;
wherein the duration quantizer comprises programmable digital signal processor logic coupled to the program memory.

14. The circuitry of claim 13, wherein the program memory is also for storing program instructions that, when executed by programmable logic, produce an error signal responsive to an input PCM input signal and the feedback PCM value, apply a digital loop filter to the error signal, and modify an received PCM input signal responsive to the loop filter;
   and wherein the error circuit, loop filter, and modifying circuitry are comprised by the programmable digital signal processor logic.

15. The circuitry of claim 13, wherein the program memory is also for storing program instructions that, when executed by programmable logic, apply a digital filter to received signals indicating desired PWM period values to produce a control signal indicative of a current PWM period value;
   and wherein the programmable digital signal processor logic is also for executing the program instructions for applying the digital filter to received signals indicating desired PWM period values.

16. The circuitry of claim 11, wherein the duration quantizer includes a memory location for storing a previous value of the feedback PCM value;
   wherein the duration quantizer receives two PCM input signal values for each PWM period;
   and wherein the quantized pulse duration value corresponds to a duration of the PWM pulse between successive transitions of the PWM pulse.

17. The circuitry of claim 16, further comprising:
   a PWM period filter, for filtering received signals indicating desired PWM period values, according to a $K^{th}$ order low-pass digital filter to produce the control signal indicative of a current PWM period value.

18. The circuitry of claim 11, wherein the duration quantizer receives one PCM input signal value for each PWM period;
   wherein the quantized pulse duration value corresponds to a duration of the PWM pulse between a transition of the PWM pulse and a midpoint of a PWM period;
   and wherein the duration quantizer comprises:
      a rising edge duration calculation function for calculating a first duration value corresponding to the duration of a PWM pulse in a first half-period, and responsive to the received PCM input signal value;
      a falling edge duration calculation function for calculating a second duration value corresponding to the duration of a PWM pulse in a second half-period, and responsive to the received PCM input signal value;
      quantizer functions for quantizing the first and second duration values to integer multiples of the master PWM clock;
      a feedback calculation function for calculating the feedback PCM value from the first and second quantized duration values.

19. The circuitry of claim 18, wherein the duration quantizer samples the current PWM period value twice for each PWM period;
   and further comprising:
      a PWM period filter, for filtering received signals indicating desired PWM period values, according to a $K^{th}$ order low-pass digital filter to produce the control signal indicative of a current PWM period value.

20. A digital audio system, comprising:
   at least one input for receiving digital input audio signals from an audio sources;
   digital audio processing circuitry for processing the digital input audio signals to produce an pulse-code modulated (PCM) audio sample stream;
   modulation circuitry for producing a pulse-width modulated (PWM) signal responsive to the PCM audio sample stream, comprising:

a duration quantizer, having an input receiving a control signal indicative of a current PWM period value, having an input receiving an input corresponding to the received PCM audio sample stream, for producing a quantized pulse duration value responsive to a current PCM audio sample value for a current PWM period value, the pulse duration value quantized to an integer multiple of a master PWM clock, and the duration quantizer also for producing a feedback PCM value corresponding to the quantized pulse duration value;

an error circuit for producing an error signal responsive to the PCM audio sample stream and to the feedback PCM value;

a loop filter for filtering the error signal;

circuitry for modifying the PCM audio sample stream applied to the duration quantizer responsive to an output of the loop filter; and an output amplifier stage for driving a loudspeaker responsive to the PWM signal.

21. The system of claim 20, further comprising:

a system controller;

and wherein the modulation circuitry further comprises:

a PWM period filter, for filtering signals from the system controller indicating desired PWM period values to produce the control signal indicative of a current PWM period value.

22. The system of claim 20, further comprising:

program memory, for storing program instructions that, when executed by programmable logic, produce a pulse duration value responsive to an input current PWM period value that is quantized to an integer multiple of a master PWM clock, and produce a feedback PCM value corresponding to the quantized pulse duration value;

wherein the duration quantizer comprises programmable digital signal processor logic coupled to the program memory.

23. The system of claim 22 wherein the program memory is also for storing program instructions that, when executed by programmable logic, produce an error signal responsive to an input PCM audio sample value and the feedback PCM value, apply a digital loop filter to the error signal, and modify received PCM audio sample values responsive to the loop filter;

and wherein the error circuit, loop filter, and modifying circuitry are comprised by the programmable digital signal processor logic.

24. The circuitry of claim 23, further comprising:

a system controller;

wherein the program memory is also for storing program instructions that, when executed by programmable logic, apply a digital filter to signals received from the system controller indicating desired PWM period values, to produce a control signal indicative of a current PWM period value;

and wherein the programmable digital signal processor logic is also for executing the program instructions for applying the digital filter to received signals indicating desired PWM period values.

25. The system of claim 20, wherein the duration quantizer includes a memory location for storing a previous value of the feedback PCM value;

wherein the duration quantizer receives two PCM input signal values for each PWM period;

and wherein the quantized pulse duration value corresponds to a duration of the PWM pulse between successive transitions of the PWM pulse.

26. The system of claim 20, wherein the duration quantizer receives one PCM input signal value for each PWM period;

wherein the quantized pulse duration value corresponds to a duration of the PWM pulse between a transition of the PWM pulse and a midpoint of a PWM period;

and wherein the duration quantizer comprises:

a rising edge duration calculation function for calculating a first duration value corresponding to the duration of a PWM pulse in a first half-period, and responsive to the current PCM audio sample value;

a falling edge duration calculation function for calculating a second duration value corresponding to the duration of a PWM pulse in a second half-period, and responsive to the current PCM audio sample value;

quantizer functions for quantizing the first and second duration values to integer multiples of the master PWM clock; and a feedback calculation function for calculating the feedback PCM value from the first and second quantized duration values.

27. The system of claim 20, wherein the digital audio processing circuitry processes the digital input audio signals to produce a plurality of PCM audio sample streams, each PCM audio sample stream associated with one of a plurality of audio channels;

and wherein the modulation circuitry produces a plurality of PWM signals, each responsive to a corresponding one of the plurality of PCM audio sample streams for an associated audio channel.

* * * * *